(12) United States Patent
Sukegawa et al.

(10) Patent No.: US 11,105,867 B2
(45) Date of Patent: Aug. 31, 2021

(54) MAGNETIC TUNNEL JUNCTION, MAGNETORESISTIVE ELEMENT AND SPINTRONICS DEVICE IN WHICH SAID MAGNETIC TUNNEL JUNCTION IS USED, AND METHOD OF MANUFACTURING MAGNETIC TUNNEL JUNCTION

(71) Applicant: NATIONAL INSTITUTE FOR MATERIALS SCIENCE, Ibaraki (JP)

(72) Inventors: Hiroaki Sukegawa, Ibaraki (JP); Thomas Scheike, Ibaraki (JP); Seiji Mitani, Ibaraki (JP); Tadakatsu Ohkubo, Ibaraki (JP); Kazuhiro Hono, Ibaraki (JP); Kouichiro Inomata, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 565 days.

(21) Appl. No.: 16/074,135

(22) PCT Filed: Jan. 31, 2017

(86) PCT No.: PCT/JP2017/003425
§ 371 (c)(1),
(2) Date: Jul. 31, 2018

(87) PCT Pub. No.: WO2017/135251
PCT Pub. Date: Aug. 10, 2017

(65) Prior Publication Data
US 2021/0123991 A1   Apr. 29, 2021

(30) Foreign Application Priority Data
Feb. 2, 2016   (JP) .............................. JP2016-018432

(51) Int. Cl.
*G11C 11/16* (2006.01)
*G01R 33/09* (2006.01)
(Continued)

(52) U.S. Cl.
CPC ......... *G01R 33/098* (2013.01); *G01R 33/093* (2013.01); *G11B 5/3909* (2013.01);
(Continued)

(58) Field of Classification Search
CPC ....... G11C 11/161; H01L 43/02; H01L 43/08; H01L 43/10; H01L 43/12; G01R 33/098; G01R 33/093; G11B 5/3909
(Continued)

(56) References Cited

U.S. PATENT DOCUMENTS 6,387,549 B1 * 5/2002 Obata ................... B82Y 10/00
257/421
2009/0097168 A1  4/2009 Inomata et al.
(Continued)

FOREIGN PATENT DOCUMENTS

JP    2013-175615    9/2013
JP    5586028        9/2014
(Continued)

OTHER PUBLICATIONS

Extended European Search Report dated Oct. 16, 2019 in corresponding European Patent Application No. 17747407.9.
(Continued)

*Primary Examiner* — Jami Valentine Miller
(74) *Attorney, Agent, or Firm* — Wenderoth, Lind & Ponack, L.L.P.

(57) ABSTRACT

The object of the present invention is to attain an unconventionally high tunnel magnetoresistance (TMR) ratio by using a barrier layer made of an $MgAl_2O_4$ type insulator material with a spinel structure. The problem can be solved
(Continued)

by a magnetic tunnel junction in which a barrier layer is made of a cubic nonmagnetic material having a spinel structure, and both of two ferromagnetic layers that are adjacently on and below the barrier layer are made of a $Co_2FeAl$ Heusler alloy. Preferably, the nonmagnetic material is made of oxide of an $Mg_{1-x}Al_x$ ($0<x\leq1$) alloy, and exhibits tunnel magnetoresistance of 250% or more and 34000% or less at a room temperature.

10 Claims, 10 Drawing Sheets

(51) Int. Cl.
   *G11B 5/39* (2006.01)
   *H01L 43/02* (2006.01)
   *H01L 43/08* (2006.01)
   *H01L 43/10* (2006.01)
   *H01L 43/12* (2006.01)

(52) U.S. Cl.
   CPC ............ *G11C 11/161* (2013.01); *H01L 43/02* (2013.01); *H01L 43/08* (2013.01); *H01L 43/10* (2013.01); *H01L 43/12* (2013.01)

(58) Field of Classification Search
   USPC ......................................................... 257/421
   See application file for complete search history.

(56) References Cited

U.S. PATENT DOCUMENTS

| | | | | |
|---|---|---|---|---|
| 2012/0091548 A1* | 4/2012 | Sukegawa | ............... | B82Y 40/00 257/421 |
| 2012/0112299 A1* | 5/2012 | Inomata | ............... | G01R 33/098 257/421 |
| 2013/0221461 A1* | 8/2013 | Sukegawa | ............... | H01L 43/08 257/421 |
| 2015/0001601 A1* | 1/2015 | Koike | ............... | H01L 29/66984 257/295 |
| 2016/0380184 A1* | 12/2016 | Kato | ............... | H01L 27/228 257/421 |
| 2016/0380185 A1* | 12/2016 | Kato | ............... | H01L 27/228 257/421 |
| 2017/0140784 A1* | 5/2017 | Sukegawa | ............... | G11B 5/65 |
| 2018/0090671 A1* | 3/2018 | Kato | ............... | H01L 27/228 |
| 2019/0157343 A1* | 5/2019 | Sasaki | ............... | H01L 43/08 |
| 2020/0357985 A1* | 11/2020 | Sukegawa | ............... | H01L 27/105 |
| 2021/0070868 A1* | 3/2021 | Basilico | ............... | C07K 16/2863 |

FOREIGN PATENT DOCUMENTS

| | | |
|---|---|---|
| JP | 2015-90870 | 5/2015 |
| JP | 2015-146395 | 8/2015 |
| WO | 2007/126071 | 11/2007 |
| WO | 2010/119928 | 10/2010 |

OTHER PUBLICATIONS

International Search Report dated Apr. 11, 2017 in International Application No. PCT/JP2017/003425.

S. Yuasa and D.D. Djayaprawira, "Giant tunnel magnetoresistance in magnetic tunnel junctions with a crystalline MgO(0 0 1) barrier", J. Phys. D: Appl. Phys. 40, R337 (2007).

W. Wang, E. Liu, M. Kodzuka, H. Sukegawa, M. Wojcik, E. Jediyka, G.H. Wu, K. Inomata, S. Mitani, and K. Hono, "Coherent tunneling and giant tunneling magnetoresistance in $Co_2FeAl$/MgO/CoFe magnetic tunneling junctions", Phys. Rev. B 81, 140402(R) (2010).

T. Scheike, H. Sukegawa, T. Furubayashi, Z.-C. Wen, K. Inomata, T. Ohkubo, K. Hono, and S. Mitani, "Lattice-matched magnetic tunnel junctions using a Heusler alloy $Co_2FeAl$ and a cation-disorder spinel Mg—Al—O barrier", Appl. Phys. Lett. 105, 242407 (2014).

W. Wang, H. Sukegawa, and K. Inomata, "Temperature dependence of tunneling magnetoresistance in epitaxial magnetic tunnel junctions using a $Co_2FeAl$ Heusler alloy electrode", Phys. Rev. B 82, 092402 (2010).

Notification of Reasons for Refusal dated Jan. 28, 2020 in Japanese Patent Application No. 2017-565561 with English-language translation.

Notification of Reasons for Refusal dated Sep. 3, 2019 in corresponding Japanese Patent Application No. 2017-565561, with English Translation.

* cited by examiner

MAGNETIC TUNNEL JUNCTION, MAGNETORESISTIVE ELEMENT AND SPINTRONICS DEVICE IN WHICH SAID MAGNETIC TUNNEL JUNCTION IS USED, AND METHOD OF MANUFACTURING MAGNETIC TUNNEL JUNCTION

TECHNICAL FIELD

The present invention relates to a magnetic tunnel junction having a structure in which a tunnel barrier layer is sandwiched by two ferromagnetic layers, and relates to its application to a magnetoresistive element and a spintronics device which use the same.

Further, the present invention relates to a method of manufacturing a magnetic tunnel junction having the structure in which the tunnel barrier layer is sandwiched by two ferromagnetic layers.

BACKGROUND ART

A magnetic tunnel junction (MTJ element) including trilayers of a ferromagnetic layer/an insulator tunnel barrier layer (barrier layer)/a ferromagnetic layer has been practically used as a magnetic head for a hard disk and a nonvolatile magnetic random access memory (MRAM) so far. In an MRAM, MTJ elements are arranged in a two-dimensional matrix, and two magnetic layers that constitute each MTJ element are controlled to be parallel and antiparallel with each other in a current direction by using a technique called spin torque magnetization reversal, thereby generating a high-resistance state and a low-resistance state so as to perform memory operations. In such an application field, for the high speed operation, an MTJ element exhibiting a high tunnel magnetoresistance (TMR) ratio and having low resistance is required. In particular, since a large current flows in the element for the operation by spin torque magnetization reversal, the element is also required to include a barrier layer having low resistance and a high breakdown voltage. Further, a technique of spin injection via a barrier layer into a semiconductor has been increasing its importance in the fields of field effect transistors (spin MOSFET) in a structure-type of metal (M)—a oxide barrier layer (O)—a semiconductor (S), by which spin-dependent output is obtained. Also in these fields, a barrier layer with low resistance is required for taking a large ON-current.

In such a background, MgO that can easily provide a high TMR ratio exceeding 100% has been broadly used as a barrier layer of an MTJ element. In the case where the MgO barrier is a crystalline material having (001) orientation, due to the characteristics of its band structure, a coherent tunnel effect that is an effect for preferentially tunneling only electrons of bands called $\Delta_1$ bands is exhibited. It is known that tunnel resistance is decreased and a TMR ratio is significantly increased at this time (Non Patent Literature 1). However, it is not easy for changing the characteristics of the MgO barrier including its lattice constant and bandgap, whereby the ferromagnetic layer material has a problem of being limited strictly. Since the MgO has lattice mismatch of, for example, 3% to 4% with CoFe-based alloys, 3% to 6% with Co-based Heusler alloys that are known as high spin-polarized materials and about 10% with FePt, misfit dislocation is inevitably and densely introduced to these interfaces due to the lattice mismatch, so that it is difficult to draw the TMR characteristics.

For decreasing such large lattice mismatch and manufacturing an MTJ element with higher quality, there is a method of using $MgAl_2O_4$ that has a spinel structure as a barrier layer (Patent Literature 1). Since $MgAl_2O_4$ has a normal spinel structure with a lattice constant of about 0.809 nm (space group (international notation): Fd-3m), and a half of its unit lattice is smaller than that of MgO (0.4213 nm) having a rock-salt structure by about 4%, $MgAl_2O_4$ exhibits very good lattice matching with ferromagnetic layers of CoFe alloys, Co-based Heusler alloys and the like, which have body-centered cubic structures (BCC structures). Further, a lattice constant of $MgAl_2O_4$ can be changed continuously by adjusting compositions of Mg and Al in $MgAl_2O_4$, whereby the lattice matching with the ferromagnetic layer can be improved more. Generally, the TMR ratio has a problem of being decreased by application of bias voltage, but it is known that this problem can be much improved by the decrease of the lattice mismatch by adopting the $MgAl_2O_4$ barrier.

However, it is known that, in the case of adopting the $MgAl_2O_4$ barrier, there is a critical problem that the TMR enhancement effect due to the coherent tunnel effect is small, and the TMR ratio is smaller than that in the case of adopting the MgO barrier (Patent Literatures 1 and 2). This problem can be physically interpreted as follows. Firstly, in the band structure of CoFe-based alloys that is broadly used as the ferromagnetic layer, a $\Delta_1$ band is present in a majority-spin band in a Fermi level, but on the other hand, the $\Delta_1$ band is absent in a minority-spin band. That is, the $\Delta_1$ band in the ferromagnetic layer is in a completely spin-polarized state. Generally, the higher a degree of the spin polarization (spin polarization) is, the larger a TMR ratio is. Thus, in the case of using the barrier layer that tunnels only the $\Delta_1$ band due to the coherent tunnel effect, effective spin polarization is increased, whereby a very high TMR ratio is realized. Although both of the MgO barrier and the $MgAl_2O_4$ barrier exhibit the coherent tunnel effect, their effectiveness of the TMR enhancement effect is different due to the difference between these crystal structures. In the case of using the MgO barrier, lattice unit sizes (repeating periods of crystals) of the barrier layer and the ferromagnetic layer are almost the same, so that the above-described TMR ratio enhancement effect appears explicitly. Whereas, in the case of the $MgAl_2O_4$ having the spinel structure, since the $MgAl_2O_4$ has a lattice unit size that is about twice as large as that of MgO, the lattice unit size of the $MgAl_2O_4$ does not match with that of the CoFe-based ferromagnetic layers. In such a case, a band folding effect that is a phenomenon of modulating a band structure of the ferromagnetic layers, which is related to electron transport, is exhibited, so that the completely spin-polarized state of the $\Delta_1$ band in the CoFe-based ferromagnetic layers is lost, thereby decreasing the effective spin polarization. Accordingly, the observed TMR ratio of the $MgAl_2O_4$ barrier becomes smaller than that of the MgO barrier.

Patent Literature 2, which is suggested by the applicant of the present application, discloses a means for obtaining a high TMR ratio in an $MgAl_2O_4$ barrier MTJ element by a method of introducing disorder that effectively decreases a lattice constant of $MgAl_2O_4$ by half. This literature discloses, as a barrier layer in the structure of the MTJ element, cubic nonmagnetic oxide that has a crystal structure, in which cation arrangement is disordered in a spinel structure, and symmetry of a space group of Fm-3m or F-43m. By using the disclosed nonmagnetic oxide, the problem of the difference in lattice unit size, which causes the band folding effect, can be solved. By this method, observed values of the TMR ratios are 479% at 15 K and 308% at a room temperature.

However, the material such as $MgAl_2O_4$ that has a spinel structure as a stable phase is changed into a spinel structure, if treated by heat at a high temperature in the process of its manufacturing. Thus, since the TMR ratio exceeding 250%, which is an index, cannot be obtained, there has been a problem of limiting a process for manufacturing the spinel oxide barrier layer.

Patent Literature 3, which is suggested by the applicant of the present application, discloses not only a method of manufacturing an MTJ element but also a structure of an MTJ element in which a barrier layer is crystalized $MgAl_2O_4$. However, there is a problem in production that a Co-based Heusler alloy layer with high quality cannot be formed on $MgAl_2O_4$, whereby a TMR ratio of 250% or more, which is an index at a room temperature, couldn't be obtained.

Patent Literature 4 discloses not only a method of manufacturing an MTJ element using Co-based Heusler alloy $Co_2Fe(S_{1-x}Al_x)$ (0<x<1) that has an $L2_1$ structure or a B2 structure, but also a structure of a TMR element in which a barrier layer sandwiched by two ferromagnetic layers of $Co_2Fe(Si_{1-x}Al_x)$ is MgO having a rock-salt structure. However, there has been a problem in principle that $Co_2Fe(Si_{1-x}Al_x)$ and MgO have lattice mismatch of several % that is a non-negligible size, more specifically, 3.8% to 5.3% of lattice mismatch, whereby interface defects cannot be suppressed.

CITATION LIST

Patent Literature

Patent Literature 1: Japanese Patent No. 5,586,028
Patent Literature 2: JP 2013-1715615 A
Patent Literature 3: JP 2015-90870 A
Patent Literature 4: WO 2007/126071 A1

Non Patent Literature

Non Patent Literature 1: S. Yuasa and D. D. Djayaprawira, J. Phys. D: Appl. Phys. 40, R337 (2007)
Non Patent Literature 2: W. Wang, E. Liu, M. Kodzuka, H. Sukegawa, M. Wojcik, E. Jedryka, G. H. Wu, K. Inomata, S. Mitani, and K. Hono, Phys. Rev. B 81, 140402(R) (2010)
Non Patent Literature 3: T. Scheike, H. Sukegawa, T. Furubayashi, Z.-C. Wen, K. Inomata, T. Ohkubo, K. Hono, and S. Mitani, Appl. Phys. Lett. 105, 242407 (2014)
Non Patent Literature 4: W. Wang, H. Sukegawa, and K. Inomata, Phys. Rev. B 82, 092402 (2010)

SUMMARY OF INVENTION

Technical Problem

In the light of the above-described problems, the present invention aims to provide a lattice-matched magnetic tunnel junction (MTJ element) which attains an unconventionally high tunnel magnetoresistance (TMR) ratio by using a barrier layer made of an $MgAl_2O_4$ type insulator material that has a spinel structure.

Further, another object of the present invention is to provide a method of manufacturing a magnetic tunnel junction that enables to efficiently manufacture an MTJ element, which does not have deliquescency that can be a problem in a wet process used while manufacturing a fine element, can provide an interface between a ferromagnetic layer/a barrier layer with high quality, and has high reliability.

Solution to Problem

In the process of study on an MTJ element using an $MgAl_2O_4$ barrier, the inventors of the present invention have found that it is possible to manufacture $Co_2FeAl$ alloy layers having a B2 structure (CsCl structure) with high spin polarization as two ferromagnetic layers that are adjacently on and below the barrier layer. As a result, the inventors have found that a high TMR ratio exceeding 340% can be obtained at a room temperature even in the case where an $MgAl_2O_4$ barrier has a spinel structure, thereby making the present invention. At this time, a lattice unit size of the $MgAl_2O_4$ spinel layer does not match with that of $Co_2FeAl$, and accordingly satisfies a condition of causing a band folding effect. However, this result shows that, by using the laminate structure of $Co_2FeAl/MgAl_2O_4/Co_2FeAl$ that includes the two $Co_2FeAl$ layers, high spin polarization of the $Co_2FeAl$ layers can be reflected, whereby such a high TMR ratio can be obtained without being influenced by the band folding effect. Further, lattice mismatch between $MgAl_2O_4$ and $Co_2FeAl$ whose crystals are grown in (001) orientation is less than 1%, so that substantially complete lattice matching can be realized, whereby the high-quality crystal MTJ element can be obtained. In the case where the lattice mismatch exceeds 3%, many mismatch defects are introduced into an interface between the barrier layer and the Heusler alloy layer, thereby causing inconvenience such as decrease of the TMR ratio, inhibition of flat film growth and increase of insulation breakdown probability. This finding is effective not only in the case where the composition is $MgAl_2O_4$ but also in the case where the barrier layer is made of another spinel oxide material. Also, it is effective for to all kinds of Co-based Heusler alloy having a B2 structure as a replace of the $Co_2FeAl$ layer and high spin polarization. Further, it means that the method for obtaining the $Co_2FeAl$ layer on the spinel barrier layer can also provide a spin injection element having a structure of a semiconductor/a barrier layer/a ferromagnetic layer of a spin MOSFET element.

That is, a first embodiment of the present invention is to provide a magnetic tunnel junction including a barrier layer and two ferromagnetic layers that are adjacently on and below the barrier layer, wherein the barrier layer is made of a cubic nonmagnetic material having a spinel structure, and both of the ferromagnetic layers are made of $Co_2FeAl$ Heusler alloy.

A second embodiment of the present invention is to provide the magnetic tunnel junction according to the first embodiment, wherein lattice mismatch between the non-magnetic material and the $Co_2FeAl$ is 3% or less, is preferably 1% or less, and is more preferably 0.5% or less.

A third embodiment of the present invention is to provide the magnetic tunnel junction according to the first or second embodiment, wherein the nonmagnetic material is made of oxide of $Mg_{1-x}Al_x$ (0<x≤1) alloy.

A fourth embodiment of the present invention is to provide the magnetic tunnel junction according to any one of the first to third embodiments, wherein the nonmagnetic material is made of $MgAl_2O_4$.

A fifth embodiment of the present invention is to provide the magnetic tunnel junction according to any one of the first to fourth embodiments, which exhibits tunnel magnetoresistance of 250% or more and 34000% or less at a room temperature.

A sixth embodiment of the present invention is to provide a spintronics device, which uses the magnetic tunnel junction according to any one of the first to fifth embodiments.

A seventh embodiment of the present invention is to provide a spin injection element, which is made of a laminated film of the nonmagnetic material according to any one of the first to sixth embodiments and a ferromagnetic body.

A method of manufacturing a magnetic tunnel junction of the present invention includes: forming an underlayer on a single crystal MgO (001) substrate (S100); forming a first ferromagnetic layer on the underlayer (S104); forming a barrier layer on the first ferromagnetic layer (S106) which includes forming an MgAl alloy layer on the substrate on which the first ferromagnetic layer is formed (S122), performing oxidation treatment of the substrate on which this MgAl alloy layer is formed (S124) and performing heat treatment of the formed $MgAl_2O_4$ that has a disordered structure; forming a second ferromagnetic layer on the substrate on which the barrier layer is formed (S108); changing a crystal structure of the tunnel barrier layer from the disordered structure into a spinel structure by performing heat treatment of the second ferromagnetic layer under predetermined heat treatment conditions (S110); and forming at least one of an upper electrode layer and a cap layer on the substrate on which this second ferromagnetic layer is formed (S112).

Advantageous Effects of Invention

According to the MTJ element of the present invention, by using the MTJ element that combines a crystalline barrier layer made of a cubic nonmagnetic material having a spinel structure and a Co-based Heusler alloy layer having high polarization, a high TMR ratio can be exhibited at a room temperature and a lattice-matched interface can be obtained, whereby a large TMR ratio at a room temperature can be utilized even at a high applied voltage.

According to the method of manufacturing a magnetic tunnel junction of the present invention, it is possible to efficiently manufacture an MTJ element, which does not have deliquescency that can be a problem in a wet process used while manufacturing a fine element, can provide a high-quality interface between a ferromagnetic layer/a barrier layer, and has high reliability.

Since the magnetic tunnel junction of the present invention can be used as a memory cell, a magnetoresistance effect element and a spintronics device using the MTJ element of the present invention is favorably used for, for example, a nonvolatile magnetoresistive random access memory (MRAM) and the like.

BRIEF DESCRIPTION OF DRAWINGS

FIG. 4(a) is an out-of-plane scanning view, and FIG. 4(b) is an in-plane scanning view.

DESCRIPTION OF EMBODIMENTS

Figure 1:
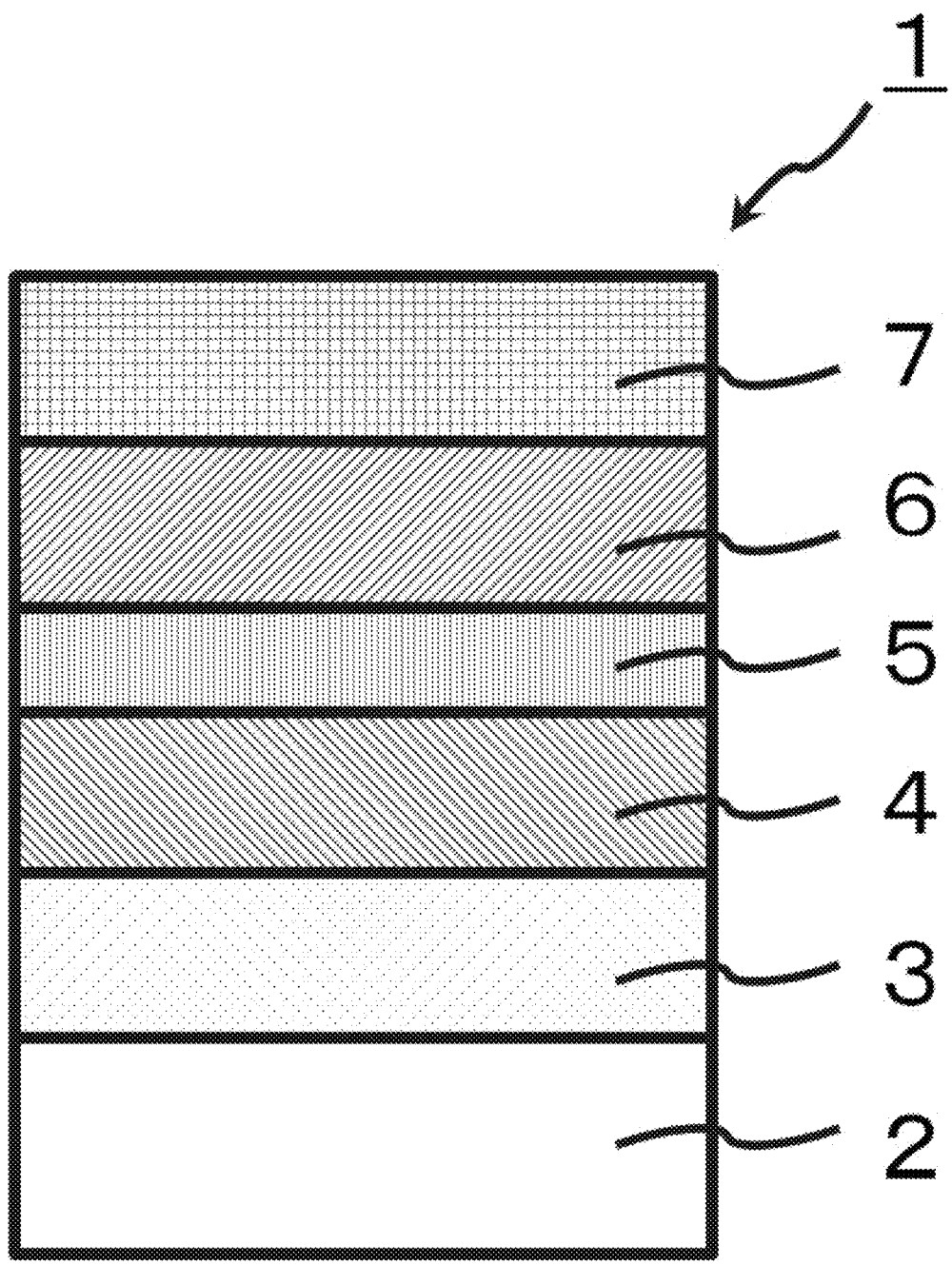
FIG. 1 is a cross-sectional view that illustrates a basic structure of a magnetic tunnel junction (MTJ element) film according to an embodiment of the present invention.

Hereinafter, a magnetic tunnel junction (MTJ) element film 1 according to each embodiment of the present invention will be described in detail with reference to FIG. 1. As shown in FIG. 1, the MTJ element film 1 in an embodiment of the present invention includes a substrate 2, an underlayer 3, a first ferromagnetic layer 4, a barrier layer 5, a second ferromagnetic layer 6 and an upper electrode 7.

The substrate 2 is a magnesium oxide (MgO) single crystal in (001) orientation, a spinel ($MgAl_2O_4$) single crystal having a spinel structure, a strontium titanate (SrTiO$_3$) single crystal, an Si single crystal or a Ge single crystal. Further, the substrate 2 may be a textured polycrystalline MgO film aligned in (001) orientation, and a magnesium-titanium oxide ($MgTiO_x$) that has a rock-salt structure as a replace of MgO and an equivalent lattice constant may be used.

The underlayer 3 is adjacently on the substrate 2, and serves as an underlayer for growing crystals of the first ferromagnetic layer 4 and also as a conductive electrode. The underlayer 3 is made of: BCC-type metal such as chromium (Cr), vanadium (V) and tungsten (W), which is grown with crystal orientation controlled; B2-type alloy such as nonmagnetic NiAl, CoAl and FeAl; or a noble metal layer of ruthenium (Ru), platinum (Pt), palladium (Pd), rhenium (Re), silver (Ag), gold (Au) or the like. Needless to say, the underlayer 3 may be a multilayer film combining them. Further, $Co_{1-x}Fe_x$ ($0 \leq x \leq 1$) alloy, which is ferromagnetic, may be used. A thickness of the underlayer 3 typically ranges from about 5 nm to about 100 nm. Moreover, for controlling the growth of the underlayer, an oxide layer made of MgO, a spinel or the like having a thickness of about 5 nm to about 50 nm may be inserted between the substrate 2 and the underlayer 3.

The first ferromagnetic layer 4 is a Co-based Heusler ferromagnetic alloy layer that is formed adjacently on the underlayer 3, and is a layer having a B2 structure (CsCl-type structure) here. Herein, the Co-based Heusler alloy is alloy that essentially has an L2$_1$ structure (Cu$_2$MnAl-type structure) and is composed of a Co$_2$XY (X=Fe, Mn, Ti, Cr or the like, Y=Si, Al, Ga, Ge, Sn or the like) composition. The Co-based Heusler is ferromagnetic, and exhibits a magnetic transition temperature (Curie temperature) that is higher than a room temperature, and many of alloy compositions have very high spin polarization. Some of the compositions have completely spin-polarized band structures (spin polarization P=1), and are called as a half metal. The B2 structure is a disordered structure in which X-Y sites in the L2$_1$ structure are randomly occupied, but it is known that its band structure is almost held. Thus, even the B2 structure exhibits P=1 that means a half metal or a high value equivalent thereto. A thickness of the first ferromagnetic layer is, for example, 5 nm, but may be smaller. A composition of the Co-based Heusler alloy may be within a composition range that can provide the B2 structure, and may have discrepancy of, for example, about 5% from a stoichiometric composition.

Next, the barrier layer 5 is provided on the first ferromagnetic layer 4. This layer is made of a nonmagnetic body that is oxide having a spinel structure, and has (001) orientation. Further, a film thickness thereof ranges from about 0.8 nm to about 3 nm. The spinel structure is a crystal structure of MgAl$_2$O$_4$, and belongs to a space group Fd-3m (No. 227). A lattice constant of the spinel is twice as high as that of alloy with a BCC structure or a B2 structure (in the case of rotating by 45° within a plane). In this case, in general, spin polarization is effectively decreased due to the band folding effect, thereby causing a problem of decreasing a TMR ratio. Whereas, in the case where the B2-type Co-based Heusler alloy layer that is used in the present embodiment is utilized as both ferromagnetic layers of the first ferromagnetic layer 4 and the second ferromagnetic layer 6, this problem is not caused, so that a high TMR ratio can be obtained. That is, since the Co-based Heusler alloy layer has the substantially high spin polarization, influence of the band folding effect becomes very small.

The cubic nonmagnetic materials having a spinel structure include ZnAl$_2$O$_4$, MgCr$_2$O$_4$, MgMn$_2$O$_4$, CuCr$_2$O$_4$, NiCr$_2$O$_4$, GeMg$_2$O$_4$, SnMg$_2$O$_4$, TiMg$_2$O$_4$, SiMg$_2$O$_4$, CuAl$_2$O$_4$, Li$_{0.5}$Al$_{2.5}$O$_4$, γ-Al$_2$O$_3$, γ-Ga$_2$O$_3$, MgGa$_2$O$_4$, ZnGa$_2$O$_4$, GeZn$_2$O$_4$ and their solid solution.

More generally, the cubic nonmagnetic material corresponds to a spinel oxide material having a composition of AB$_2$O$_4$, where A and B are metal elements. Herein, each of A and B is generally Li, Mg, Al, Si, Sc, V, Ti, Cr, Mn, Fe, Co, Ni, Cu, Zn, Ga, Cd, In, Sn or the like. The spinel structure includes a positive spinel structure and a negative spinel structure, and either of them and their mixture exhibit the similar effects. This fact is applicable to the above-described γ-Al$_2$O$_3$ and γ-Ga$_2$O$_3$, because they also have spinel-like structures. Further, LiAl$_5$O$_8$ (Li$_{0.5}$Al$_{2.5}$O$_4$) or LiGa$_5$O$_8$ (Li$_{0.5}$Ga$_{2.5}$O$_4$) having P4$_3$32 (No. 212) or P4$_1$32 (No. 213) that is a structure in which A atoms and B atoms are highly ordered is also included in this layer. Moreover, they are not required to satisfy an atom ratio of A:B=1:2 that is a stoichiometric composition, and may have the above-described spinel structure or a symmetric property of a spinel-like structure as a long periodic structure.

The second ferromagnetic layer 6 is provided adjacently on the barrier layer 5. This layer is a ferromagnetic Co-based Heusler alloy layer having a B2 structure similarly to the first ferromagnetic layer 4. A film thickness thereof ranges from about 1 nm to about 8 nm. Between the first ferromagnetic layer 4 and the barrier layer 5, and between the barrier layer 5 and the second ferromagnetic layer 6, a layer having a thickness of about 1 nm or less can also be inserted for decreasing interfacial damage and improving an interface state. At this time, the layer to be inserted is limited to a layer that does not decrease effective spin polarization of the first ferromagnetic layer 4 and the second ferromagnetic layer 6. For this purpose, for example, Fe, CoFe alloys, Co-based Heusler alloys, Mg, MgAl alloys, Al and MgO are applicable.

The upper electrode 7 is a layer that is provided adjacently on the second ferromagnetic layer 6. Typically, the upper electrode 7 is Ru. Also, Ta, Pt and the like can be used. Further, for applying unidirectional magnetic anisotropy into a film surface of the second ferromagnetic layer 6, an IrMn layer of an antiferromagnetic layer having a thickness of about 8 nm to about 15 nm can be inserted between the second ferromagnetic layer 6 and the upper electrode 7.

The barrier layer 5 and its upper layers in the MTJ element film structure of the embodiment of the present invention can be used directly as a spin injection/spin detection part with respect to a semiconductor layer of the spin MOSFET. If using them for this purpose, on the semiconductor layer of Si or Ge, a barrier layer having a spinel structure, a Co-based Heusler alloy layer having a B2 structure and an upper electrode layer can be formed in this order.

Figure 2:
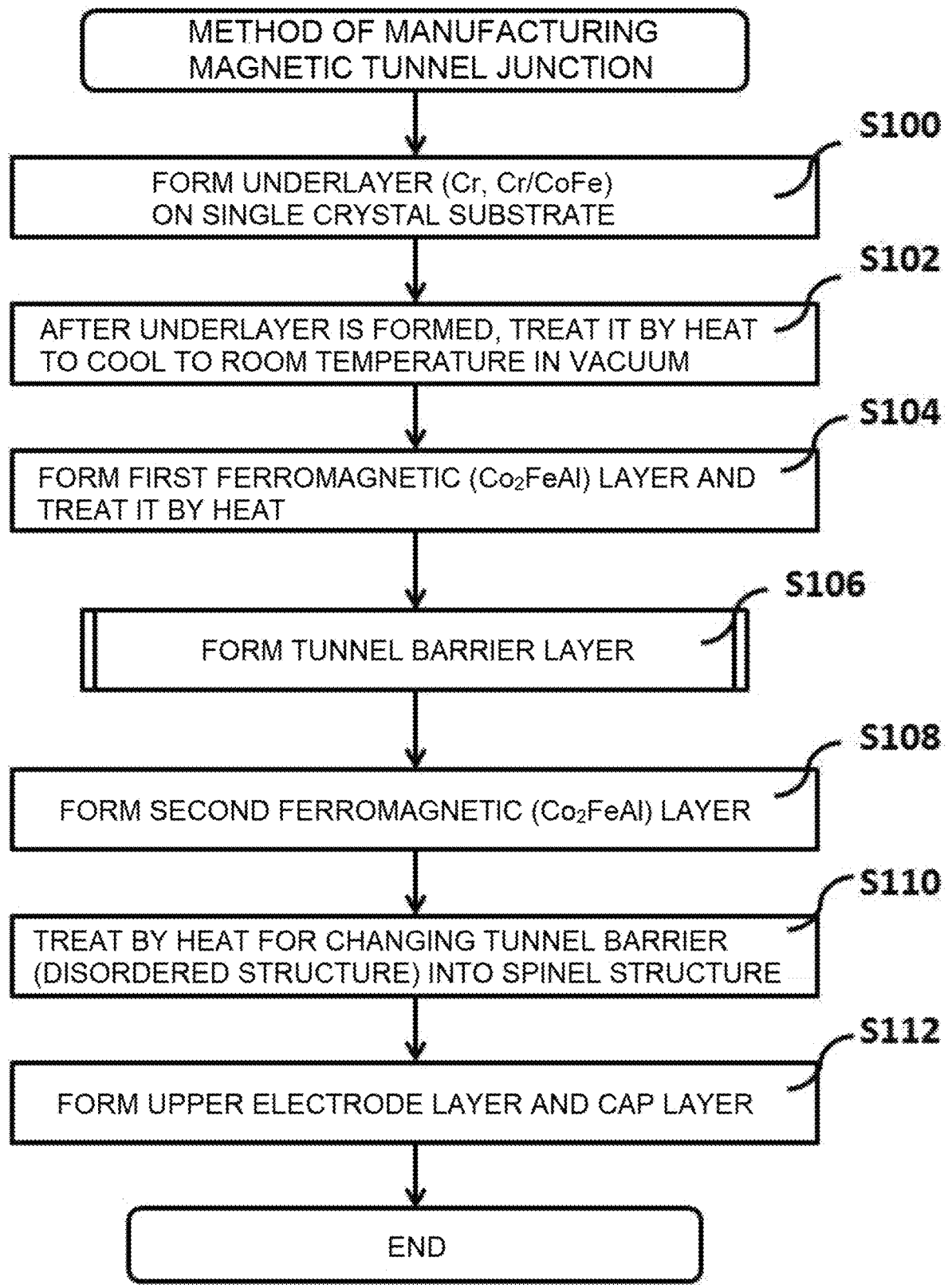
FIG. 2 is a flowchart that explains a method of manufacturing a magnetic tunnel junction (MTJ element) film according to an embodiment of the present invention.
Figure 3:
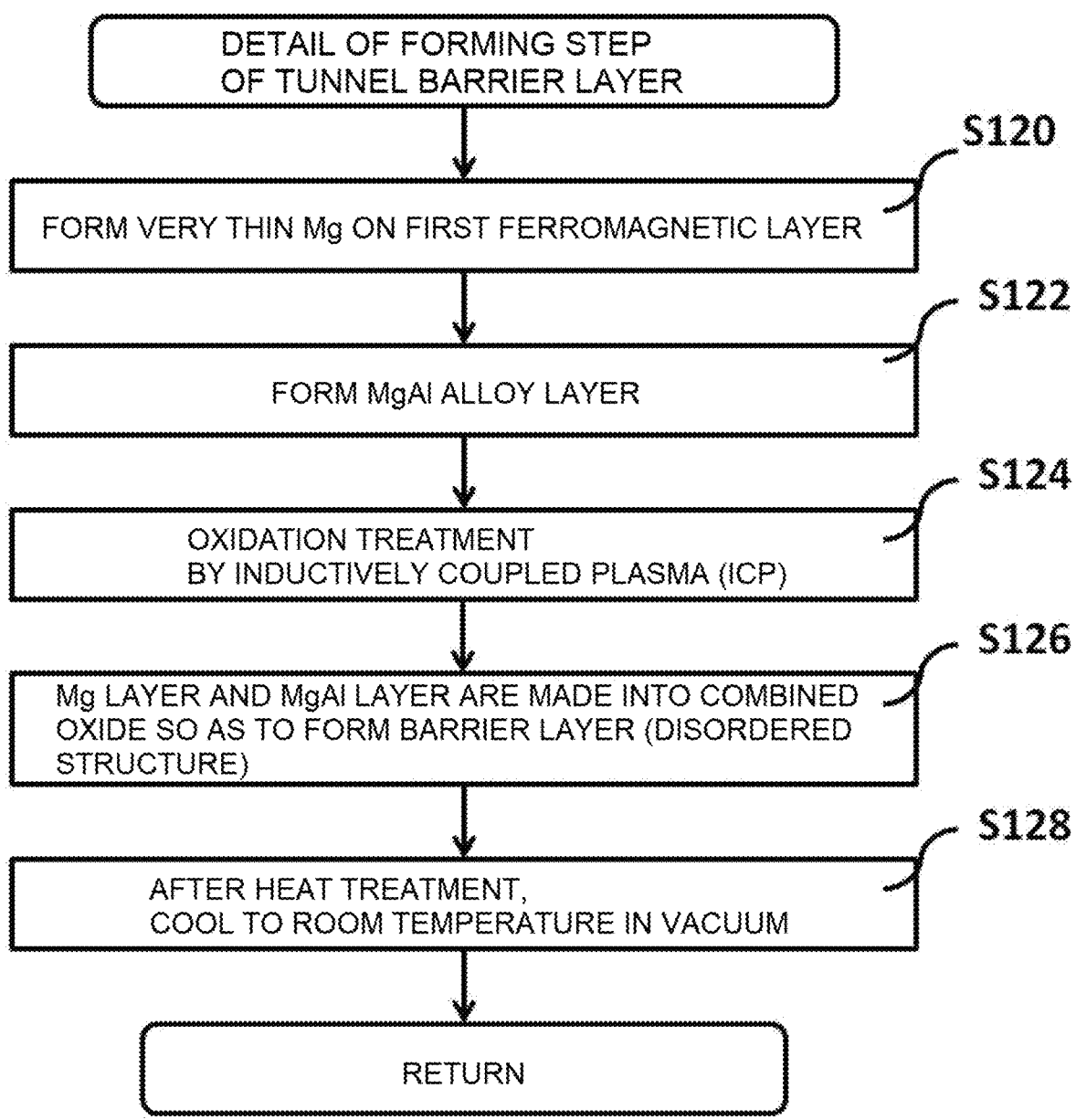
FIG. 3 is a flowchart that explains a detailed part of a process for forming a barrier layer.

Hereinafter, a process for manufacturing an MTJ element film will be explained with reference to flowcharts. FIG. 2 is a flowchart that explains a method of manufacturing an MTJ element film according to an embodiment of the present invention. FIG. 3 is a flowchart that explains a detailed part of a process for forming a barrier layer.

The underlayer is formed on a single crystal substrate, for example, MgO (001) (S100). For this film formation, for example, an ultrahigh vacuum direct current magnetron sputtering apparatus is used. As the underlayer, for example, Cr is used, and a thickness thereof preferably ranges from, for example, 20 nm to 100 nm, and particularly preferably ranges from 30 nm to 50 nm.

For improving crystallinity and flatness of the underlayer, a Cr layer that is the underlayer is treated by heat after it is formed (S102). A heat treatment temperature has an appropriate range depending on an underlayer material, and, for example, the Cr underlayer is preferably heated at 400° C. to 900° C., and is particularly preferably heated at 600° C. to 800° C. The heat treatment is preferably carried out in a vacuum chamber, and a heat treatment time preferably ranges from about 3 minutes to about 3 hours, and particularly preferably ranges from about 30 minutes to about 1 hour. After the heat treatment, the underlayer is preferably cooled to a room temperature. In the case where the underlayer is made of a bi-layer film of Cr/CoFe, a Cr layer is formed by the above-described method, and a CoFe layer with a film thickness of, for example, 10 nm is thereafter manufactured from a Co$_{50}$Fe$_{50}$ composition target by sputtering at a room temperature.

Subsequently, a first ferromagnetic layer is formed on the underlayer (S104). In the case of using a Co$_2$FeAl layer as the first ferromagnetic layer, a Co$_2$FeAl layer having a film thickness of, for example, 5 nm is manufactured from a Co$_{50}$Fe$_{25}$Al$_{25}$ composition target by sputtering. Thereafter, the substrate on which the first ferromagnetic layer is formed is treated by heat (S104). For example, the heat treatment is carried out at 250° C. to 400° C. in a vacuum chamber for about 10 minutes to about 30 minutes, and then is cooled to a room temperature.

Next, a barrier layer is formed (S106).

Detail of this formation process will be described with reference to FIG. 3. Preferably, an Mg layer is firstly formed on the substrate, which is treated by heat in S104, at a room temperature (S120). This Mg layer is preferably formed by using, for example, direct current (DC) sputtering so as to have a film thickness of about a half of a single layer to about five layers of atoms (0.1 nm to 1.0 nm). Next, this laminated film is moved into a chamber for oxidation so as to form an MgAl alloy layer (S122). In this film formation, the MgAl alloy layer is formed from an $Mg_{17}Al_{83}$ alloy composition target by, for example, high frequency (RF) sputtering so as to have a film thickness of, for example, about three layers to about ten layers of atoms (0.5 nm to 2.5 nm). Incidentally, in the method of manufacturing the MTJ element film according to the present embodiment, the step S120 can be omitted. Further, in the step S120, as a replace of the Mg layer, an MgAl layer including a higher Mg content than that of the MgAl alloy layer, which is formed in the step S122, may be formed. Moreover, these Mg layer and MgAl layer may contain oxygen.

Subsequently, the substrate on which this MgAl alloy layer is formed is treated by oxidation (S124). Firstly, mixed gas of argon and oxygen is introduced into a chamber for oxidation. Next, oxidation treatment is performed by inductively coupled plasma (ICP). Then, the Mg layer and the MgAl layer are made into combined oxide so as to form a barrier layer (S126). The oxidation treatment may be carried out also by a method of introducing pure oxygen at, for example, 5 Pa into a vacuum chamber and holding it for 1 minute to 1 hour so as to obtain the barrier layer as a natural oxidation film. When completing this oxidation treatment, the barrier layer has not a spinel structure but a disordered structure. After this oxidation treatment, heat treatment is preferably conducted at 250° C. to 300° C. in vacuum for about 10 minutes to about 30 minutes for promoting crystallization. After the heat treatment, the substrate is cooled to a room temperature (S128).

Next, as shown in FIG. 2, a second ferromagnetic layer is formed on the substrate on which the barrier layer is formed (S108). As a layer that corresponds to the second ferromagnetic layer, for example, $Co_2FeAl$ (5 nm to 20 nm) is manufactured from an alloy target having a composition of $Co_2FeAl$ by direct current sputtering.

Thereafter, this layer is treated by heat so as to change a structure of the barrier layer into a spinel structure. For this, the heat treatment is preferably carried out at a temperature of $T_{CFA}$=450° C. to 600° C. for about 15 minutes to about 60 minutes (S110).

Subsequently, after cooling the substrate to the room temperature, a protective film of IrMn (8 nm to 15 nm) or Ru (2 nm to 20 nm) is formed as a cap layer at a room temperature (S112). Incidentally, an upper electrode layer may be formed in addition.

Hereinafter, with reference to FIGS. 4 to 9, characteristics of the barrier layer of the present embodiment and the MTJ element using the same will be described by way of following examples.

EXAMPLE 1

Figure 4:
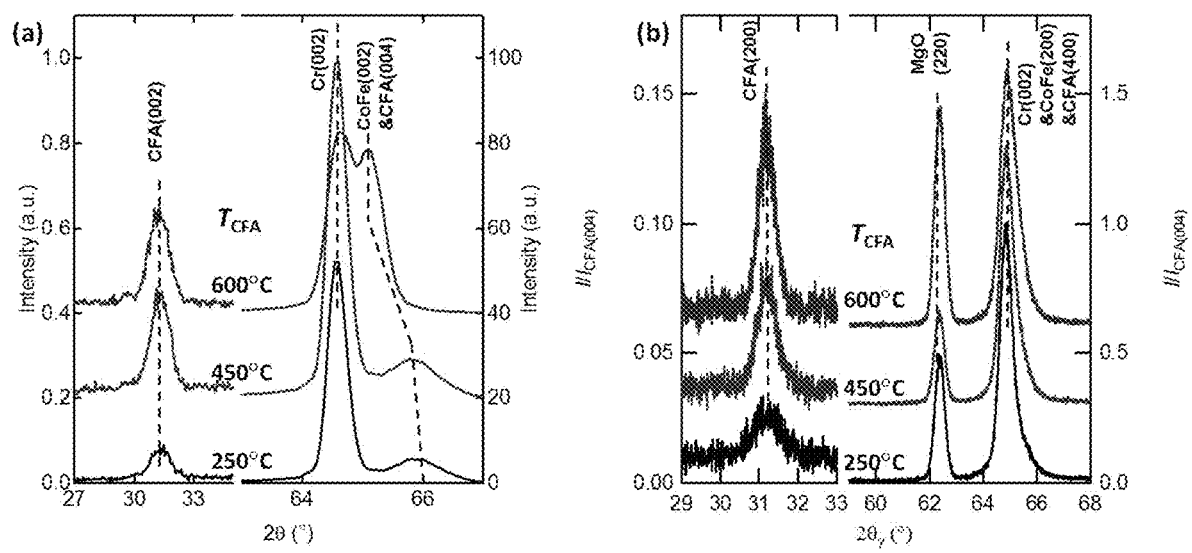
FIG. 4 is an X-ray diffraction profile showing that a $Co_2FeAl$ layer can be manufactured on an $MgAl_2O_4$ layer. A result obtained by forming a $Co_2FeAl$ layer with a thickness of 10 nm on a $Cr/CoFe/MgAl_2O_4$ and changing a post-anneal temperature.

Firstly, a method of manufacturing a Co-based Heusler alloy layer, which is the second ferromagnetic layer 6, adjacently on a spinel $MgAl_2O_4$ layer, which is the barrier layer 5, will be shown with reference to FIG. 4. As an example of the Co-based Heusler alloy layer, a case of a $Co_2FeAl$ layer will be described. Using an ultrahigh vacuum direct current magnetron sputtering apparatus, a Cr layer (40 nm) was manufactured as an underlayer on a single crystal MgO (001) substrate at a room temperature. For improving crystallinity and flatness, the Cr layer was treated by heat at 500° C. in a vacuum chamber for 1 hour after it was formed, and then was cooled to a room temperature. Thereon, a CoFe layer (10 nm) was manufactured from a $Co_{50}Fe_{50}$ composition target by sputtering, was subsequently treated by heat at 250° C. in a vacuum chamber for 15 minutes, and was cooled to a room temperature.

Subsequently, Mg (0.45 nm) was formed at a room temperature, and this laminated film was moved into a chamber for oxidation. An MgAl alloy layer (0.75 nm) was formed from an $Mg_{17}Al_{83}$ alloy composition target by high frequency (RF) sputtering. A composition of the formed MgAl film was $Mg_{19}Al_{81}$. Thereafter, mixed gas of argon and oxygen was introduced into the chamber for oxidation so as to perform oxidation treatment by inductively coupled plasma (ICP), whereby the Mg layer and the MgAl layer are made into combined oxide so as to form a barrier layer. The gas introduced at this time was 5 Pa of argon gas and 1 Pa of oxygen gas. For forming the ICP, 5 W and 100 W of RF power were applied respectively to a 2-inch diameter sputtering target and a single coil disposed near the sputtering target. During the oxidation, a shutter is provided between the generated ICP and the sample, whereby influence of the ICP was weaken so as to adjust oxidation power. An oxidation time was 50 seconds. At this time, the barrier layer had not a spinel structure but a disordered structure.

The laminated film was moved into the film formation chamber again, and was treated by heat at a temperature of 250° C. for 15 minutes. Subsequently, as a layer that corresponds to the second ferromagnetic layer, a $Co_2FeAl$ (10 nm) was manufactured from an alloy target having a composition of $Co_{47.4}Fe_{24.4}Al_{28.2}$ by direct current sputtering. A composition of the manufactured $Co_2FeAl$ layer was found as $Co_{49}Fe_{26}Al_{25}$ by composition analysis, and this composition was confirmed to be a substantial stoichiometric composition of $Co_2FeAl$. Thereafter, this layer was treated by heat at a temperature of $T_{CFA}$=250° C. to 600° C. for 15 minutes. Incidentally, the barrier layer is changed into a spinel structure at $T_{CFA}$=450° C. to 550° C. approximately. Subsequently, after cooling the substrate to a room temperature, an Ru (2 nm) protective film was formed as a cap layer at a room temperature.

FIG. 4 shows X-ray diffraction (XRD) patterns of the films manufactured at $T_{CFA}$=250° C., 450° C. and 600° C., respectively. Incidentally, for easier visibility, the patterns of $T_{CFA}$=450° C. and 600° C. were displayed to be shifted vertically upwards. Further, the $MgAl_2O_4$ layer and the Ru layer are as thin as 2 nm or less, and thus are not observed in this measurement. FIG. 4(a) shows XRD patterns in an out-of-plane direction. At each of the temperatures, a $Co_2FeAl$ (referred to as CFA) (002) peak is obtained, and this peak is a superlattice peak of a B2 structure. Thus, either of the $Co_2FeAl$ films have at least B2 structures. FIG. 4(b) illustrates a result of in-plane XRD scan, which is obtained by allowing X-ray to enter the MgO substrate in [110] orientation.

Either of FIGS. 4(a) and 4(b) show that, since (002) and (200) peak intensity is increased by the temperature increase, B2 order is increased. Further, only a (00L) peak (L is an even number) is observed by the in-plane scan (FIG. 4(a)) and only an (L00) peak is observed from the formed layer by the out-of-plane scan (FIG. 4(b)), which suggests that all of the Cr layer, the CoFe layer, the $MgAl_2O_4$ layer, and the $Co_2FeAl$ layer are grown epitaxially in (001) orientation. Moreover, on a high angle region of the in-plane scan, a peak of CoFe (002) and CFA (004) that are overlapped, in addition to the Cr (002) peak, can be obtained. This corresponds to the fact that lattice constants of CoFe and $Co_2FeAl$ are almost equal.

Further, it can be found that, in the scan at a higher temperature of $T_{CFA}=600°$ C., positions of these peaks become closer. This fact suggests that the Cr layer and the CoFe layer and others are interdiffused, and crystallinity of interfaces between the respective layers are decreased. Near 65° in FIG. 4(b), peaks of the three layers of Cr (200), CoFe (200) and $Co_2FeAl$ (400) appear being overlapped with each other. Thus, this fact suggests that lattice spacing within film surfaces of these layers are quite equal. Therefore, this suggest that in-plane lattice spacing of the $MgAl_2O_4$ layer formed between the CoFe layer and the $Co_2FeAl$ layer is also equal to them, and a lattice-matched structure can be obtained. Accordingly, it can be found that high crystallinity is exhibited consistently throughout from the Cr layer to the $Co_2FeAl$ layer. From the above result, it can be found that the $Co_2FeAl$ layer can be formed directly on the $MgAl_2O_4$ by the manufacturing method of the present invention, and is effective because it can be obtained as a flat layer with the high B2 order.

EXAMPLE 2

Next, an example of forming an MTJ element by applying the method shown in Example 1 will be described with reference to FIG. 5.

Using the same ultrahigh vacuum direct current magnetron sputtering apparatus as that in Example 1, a film having two layers of Cr (40 nm)/CoFe (5 nm) was manufactured as an underlayer on a single crystal MgO (001) substrate at a room temperature. After the formation of the Cr layer, heat treatment was carried out at 500° C. in vacuum. Thereon, $Co_2FeAl$ (5 nm) was manufactured as the first ferromagnetic layer by sputtering in the same method as that in Example 1. Thereafter, the $Co_2FeAl$ film was treated by heat at 250° C. similarly to the underlayer in order to improve the crystallinity of the $Co_2FeAl$ film, and was cooled to a room temperature. Subsequently, Mg (0.45 nm) was formed at a room temperature, and this laminated film was moved into a chamber for oxidation. Subsequently, a layer of Mg (0.45 nm)/MgAl alloy (0.75 nm) was formed in the same method as that in Example 1, and was thereafter treated by oxidation so as to form a barrier layer. Oxidizing conditions at this time were also the same as those in Example 1. Next, the above-described laminated film was moved into the film formation chamber again so as to be treated by heat at 250° C. for 15 minutes.

Subsequently, $Co_2FeAl$ (6 nm) was formed as the second ferromagnetic layer, and this layer was treated by heat at a temperature of $T_{CFA}=250°$ C. to 500° C. for 15 minutes. Thereafter, as an upper electrode layer, a laminated film of CoFe (0.5 nm)/IrMn (12 nm)/Ru (10 nm) was formed at a room temperature, thereby manufacturing a spin valve-type MTJ element. At this time, the CoFe layer had a role of reinforcing a magnetic couple between the upper $Co_2FeAl$ layer and the IrMn layer. Further, the Ru was a protective film and served as a mask in microfabrication.

Next, the manufactured multilayer film was taken out from the vacuum chamber, and a whole of the laminated film was treated by heat at a temperature of 175° C. in another vacuum chamber for 30 minutes, while a magnetic field of 5 kOe was applied thereto, whereby unidirectional anisotropy was added to the upper $Co_2FeAl$ layer. Thereafter, the laminated film was micromachined into a size of about 10 µm×5 µm by photolithography and Ar ion milling. In the micromachining, after forming a mask of a photoresist into a shape of the element, the laminated film from the upper Ru layer to the $MgAl_2O_4$ layer was etched by ion milling, thereby manufacturing a cylindrical element. Thereafter, a silicon oxide layer was formed as an interlayer insulation film, thereby electrically insulating the upper electrode and the lower electrode from each other. Subsequently, after lifting off the photoresist, electric wirings made of gold were formed respectively from the lower Cr layer and the upper Ru layer. Transport characteristics of the manufactured microfabricated element were evaluated by a direct current four-terminal method while changing an external magnetic field. At this time, a change in resistance value due to the external magnetic field was measured so as to determine a TMR ratio. The TMR ratio was defined as TMR ratio $(\%)=100\times(R_{AP}-R_p)/R_p$, where resistance while magnetization of the two layers of $Co_2FeAl$ layer was parallel and resistance while the magnetization was antiparallel were denoted as $R_p$ and $R_{AP}$, respectively.

Figure 5:
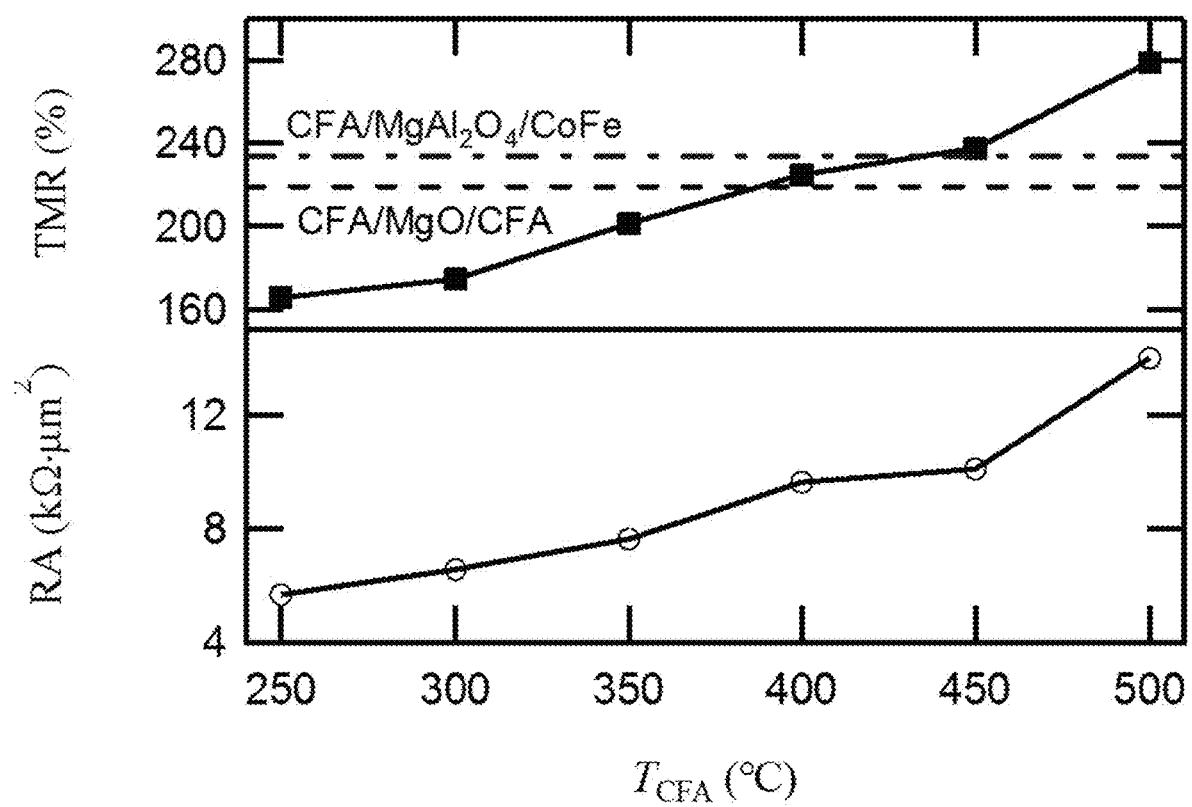
FIG. 5 is a view that illustrates a relation of a TMR ratio and a Resistance-Area (RA) value of an upper $Co_2FeAl$ layer in a magnetic tunnel junction (MTJ element) at a post-anneal temperature ($T_{CFA}$).

FIG. 5 illustrates heat treatment temperature $T_{CFA}$ dependence of a TMR ratio (upper figure) and a resistance-area (RA) value (lower figure), which is measured at a room temperature, after the formation of the upper $Co_2FeAl$ layer. A bias voltage used at this time was 10 mV or less. In the figure of the TMR ratio, values of $Co_2FeAl/MgO/Co_2FeAl$ (Non-Patent Literature 2) and $Co_2FeAl/MgAl_2O_4/CoFe$ (Non-Patent Literature 3) are illustrated respectively by a dotted line and a dashed line as comparative examples. From these figures, it can be realized that the TMR ratio of the manufactured MTJ element was increased as $T_{CFA}$ increased. Further, the TMR ratio becomes higher than that of $Co_2FeAl/MgO/Co_2FeAl$ at $T_{CFA}=400°$ C. or more (that of $Co_2FeAl/MgAl_2O_4/CoFe$ at $T_{CFA}=450°$ C. or more). The higher value was obtained due to the contribution of the two $Co_2FeAl$ layers that are adjacently on and below the $MgAl_2O_4$ layer. Thus, it shows that the use of the structure of $Co_2FeAl/MgAl_2O_4/Co_2FeAl$ is effective. Further, the RA value is also increased according to the increase of $T_{CFA}$, thereby showing that the interface structure between $Co_2FeAl$ and $MgAl_2O_4$ was changed at the same time.

EXAMPLE 3

Next, an example of forming an MTJ element by applying the method described in Example 2 so as to improve a TMR ratio will be described with reference to FIGS. 6 to 9. Using the same apparatus and method as those in Example 2, a multilayer film of Cr (40 nm)/CoFe (5 nm)/lower $Co_2FeAl$ (5 nm) was formed on an MgO (001) substrate. Thereafter, a CoFe layer of 0.5 nm was formed by a direct current sputtering method. Immediately thereafter, the film was treated by heat at 250° C. in vacuum for 15 minutes, and was cooled to a room temperature. Subsequently, an $MgAl_2O_4$ barrier layer and an upper $Co_2FeAl$ layer were formed by the same method as those in Examples 1 and 2, and were treated by heat at a temperature of $T_{CFA}=550°$ C. in vacuum. After cooling to a room temperature, a laminated film of CoFe (0.5 nm)/IrMn (12 nm)/Ru (10 nm) was formed as an upper electrode layer by the same method as that in Example 2, thereby manufacturing a spin valve-type MTJ element. Then, after carrying out heat treatment at a temperature of 175° C. in a magnetic field for 30 minutes, a microfabricated element was manufactured, and TMR ratios were measured. Further, current-voltage characters were measured, and were then differentiated, thereby obtaining a differential conductance curve (dI/dV curve).

Figure 6:
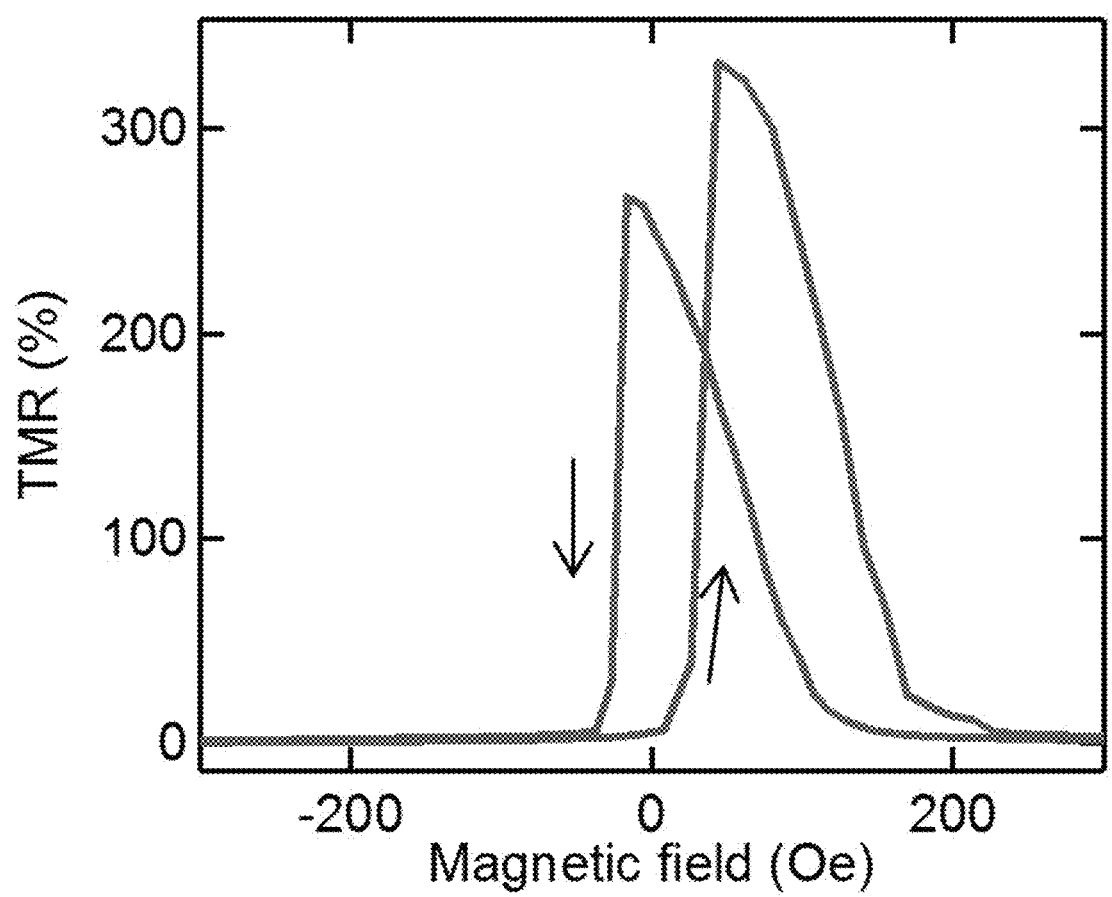
FIG. 6 is a view that illustrates a TMR curve of a sample that has a structure of a lower $Co_2FeAl$/a CoFe insertion layer (0.5 nm)/$MgAl_2O_4$/an upper $Co_2FeAl$ and a post-anneal temperature of $T_{CFA}=550°$ C.

FIG. 6 is a view that illustrates magnetic field dependence of TMR ratio of the MTJ element having the above-described structure of $Co_2FeAl$/a CoFe insertion layer/$MgAl_2O_4$/$Co_2FeAl$, which was measured at a room temperature (TMR curve). As the highest TMR ratio of this sample, 342% was obtained. Further, the TMR ratio measured at 4 K was 616%. This result indicates that, by inserting the very thin CoFe layer between the lower $Co_2FeAl$ layer and the $MgAl_2O_4$ layer, damage by the oxidation process can be decreased, so that the TMR ratio can be substantially improved. Since this TMR ratio is significantly higher than 308% that is the value obtained from the CoFe/$MgAl_2O_4$ (having a disordered spinel structure)/CoFe at a room temperature, the effectiveness of the MTJ element structure and the manufacturing method described in the embodiments of the present invention can be proved.

Figure 7:
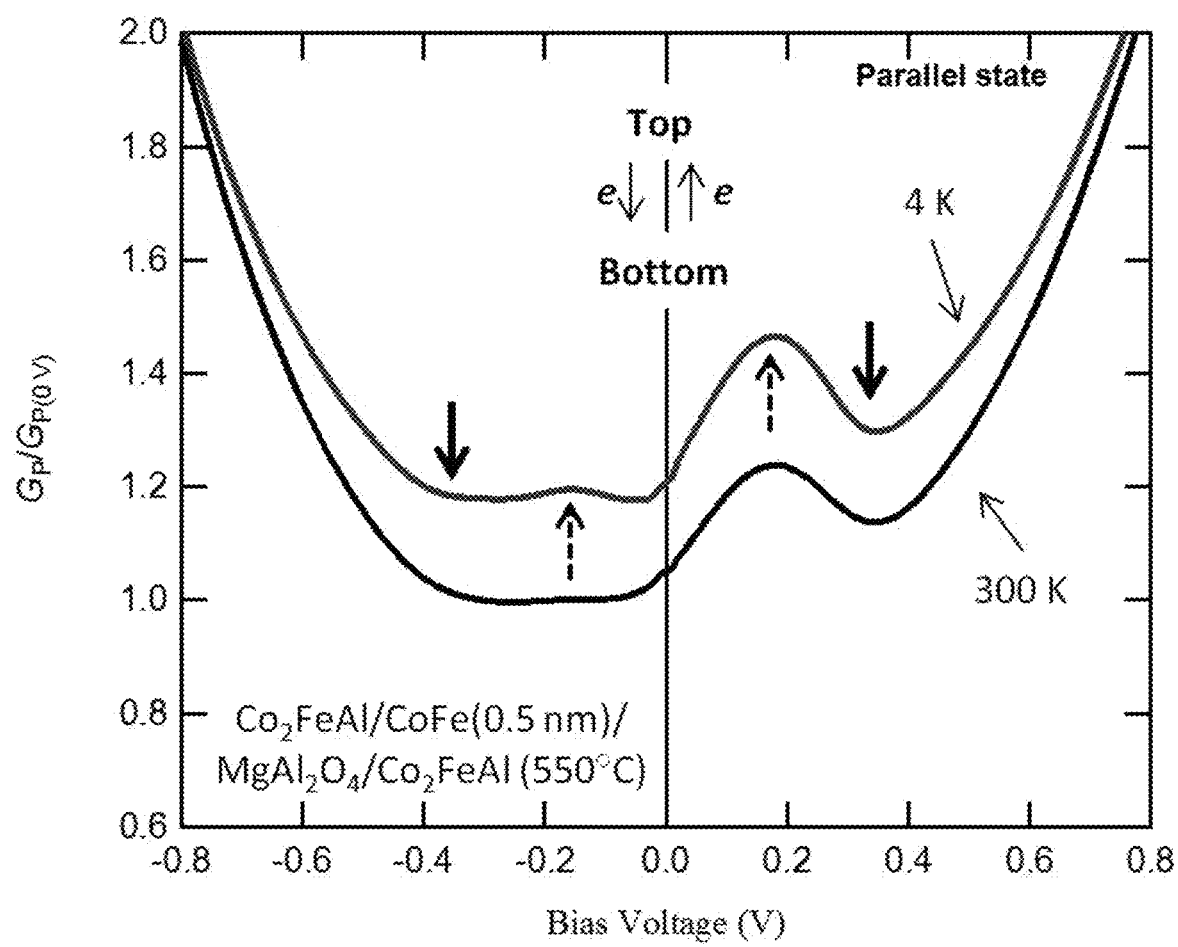
FIG. 7 is a view showing differential conductance curves of the sample shown in FIG. 6 at 300 K and 4 K.
Figure 8:
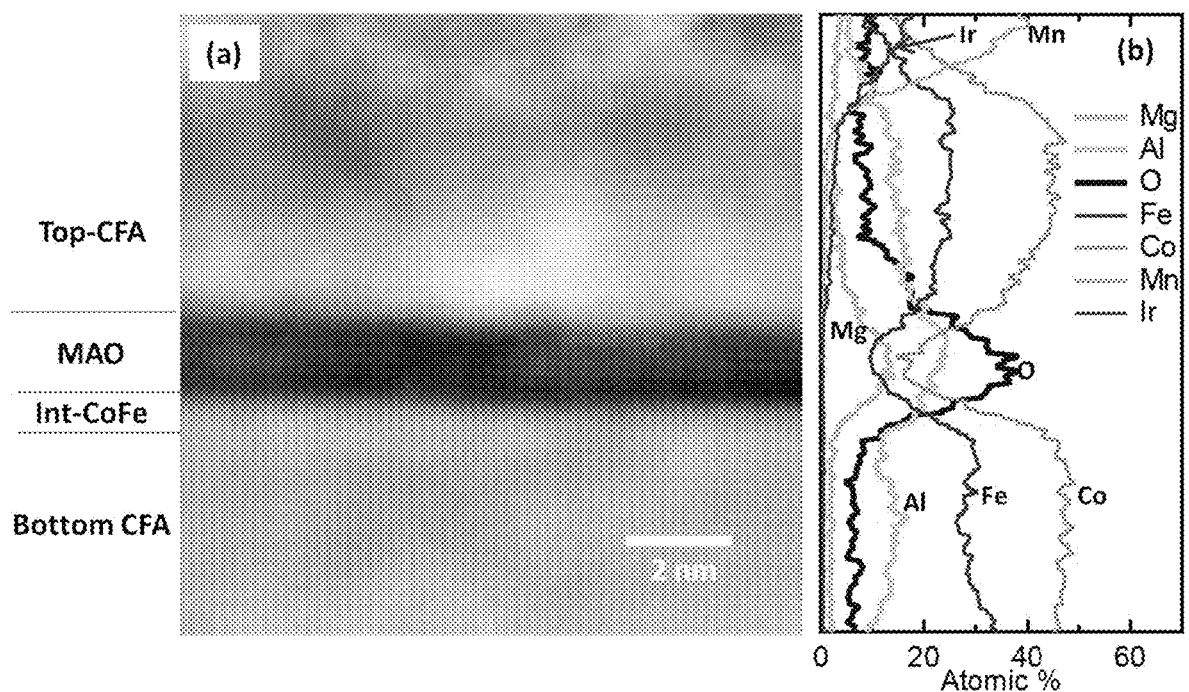
FIG. 8(a) illustrates an image (ADF-STEM image) of a cross-section of the sample shown in FIG. 6, which is observed by an annular dark-field method.
FIG. 8(b) is a view that illustrates an atom ratio profile of the region corresponding to FIG. 8(a), which is identified by energy dispersive X-ray spectroscopy (EDS).

FIG. 7 is a view showing a change of a differential conductance curve of the MTJ element having the above-described structure of $Co_2FeAl$/CoFe insertion layer/$MgAl_2O_4$/$Co_2FeAl$ at a room temperature (300 K) and a low temperature (4 K) (a parallel magnetic configuration state). In this figure, a value of a zero bias voltage is normalized to be 1. Incidentally, for easier visibility, the curve at 4 K is displayed to be shifted vertically upwards. Such a differential conductance curve is known to reflect an electronic state between a barrier layer and a ferromagnetic layer, and a transport mechanism and crystal quality can be judged thereby. Both of the differential conductance curves at 300 K and 4 K are asymmetry with respect to a voltage direction. Further, in the curve at 4 K, minimal structures are observed near ±0.35 V as marked with solid line arrows, and maximal structures are observed near ±0.2 V as marked with dotted line arrows. Their asymmetricity means that states of the interfaces of the upper and lower barrier layers are different. Whereas, from the fact that the maximal and minimal structures are observed at substantially the equal positive and negative voltage positions, it can be considered that a specific electric structure is reflected to $Co_2FeAl$, to a greater or lesser extent. Further, since a flat region is formed in a negative bias direction (a direction of an electron e flowing from the upper electrode to the lower electrode), it can be suggested that an electronic structure of the upper $Co_2FeAl$ layer is specific. Since such behavior of the differential conductance curve has been reported also in the case where an electrode is tunneled from a half metal layer having a bandgap in a minority-spin band, it is expected that the upper $Co_2FeAl$ layer is half-metallic. Whereas, since such a clear flat structure cannot be observed in a positive voltage direction, it can be considered that the lower $Co_2FeAl$ layer is not a half metal, and spin polarization thereof is lower than that of the upper layer. This is considered to indicate that the insertion of the CoFe layer weakened the characteristics of the lower $Co_2FeAl$ layer, and reduction of damage of the lower $Co_2FeAl$ interface by the oxidation process was not sufficient. The fact that the high TMR ratio exceeding 340% was nevertheless obtained at a room temperature also indicates a further room for improvement.

In order to check the detailed crystal structures of the respective layers, a cross section of the above-described MTJ element film was observed by a scanning transmission electron microscope (STEM). FIG. 8(a) shows an image of a cross-sectional structure observed by an annular dark-field method (ADF-STEM), which is cut out from the MgO substrate of the above-described laminated film in [110] orientation, near the $MgAl_2O_4$ layer (referred to as a MAO layer in the figure). Epitaxial growth with completely matched lattice can be found from the lower $Co_2FeAl$ layer to the upper $Co_2FeAl$ layer. Further, both of the upper and lower interfaces of the $MgAl_2O_4$ layer are comparatively flat, and no clear defect can be found. Thus, lattice mismatch between the upper and lower $Co_2FeAl$ layers and the $MgAl_2O_4$ layer is smaller than 1%, which indicates that their lattices are matched.

Next, FIG. 8(b) illustrates concentration profiles of respective elements in a region corresponding to FIG. 8(a), which are determined by energy dispersive X-ray spectroscopy (EDS). In the $MgAl_2O_4$ layer, the respective elements of Mg, Al and O can be observed, and a composition close to that of $MgAl_2O_4$ was obtained. Further, although Al in the upper and lower $Co_2FeAl$ layers was slightly decreased from their original compositions, degrees of interdiffusion in the respective layers were small, and it can be recognized that the interfaces between the respective layers can be defined. Moreover, since presence of the Al elements can be observed also in the lower CoFe insertion layer, which is shown as Int-CoFe in FIG. 8(a), it can be considered that a small amount of Al atoms were diffused and moved into the CoFe insertion layer due to the high heat treatment temperature (550° C.). Thus, it can be considered that the CoFe insertion layer on the lower interface contributed not only to a high oxidation damage suppressing effect but also to the TMR ratio which exhibited a higher effect as the composition shifted from CoFe to $Co_2FeAl$.

Figure 9:
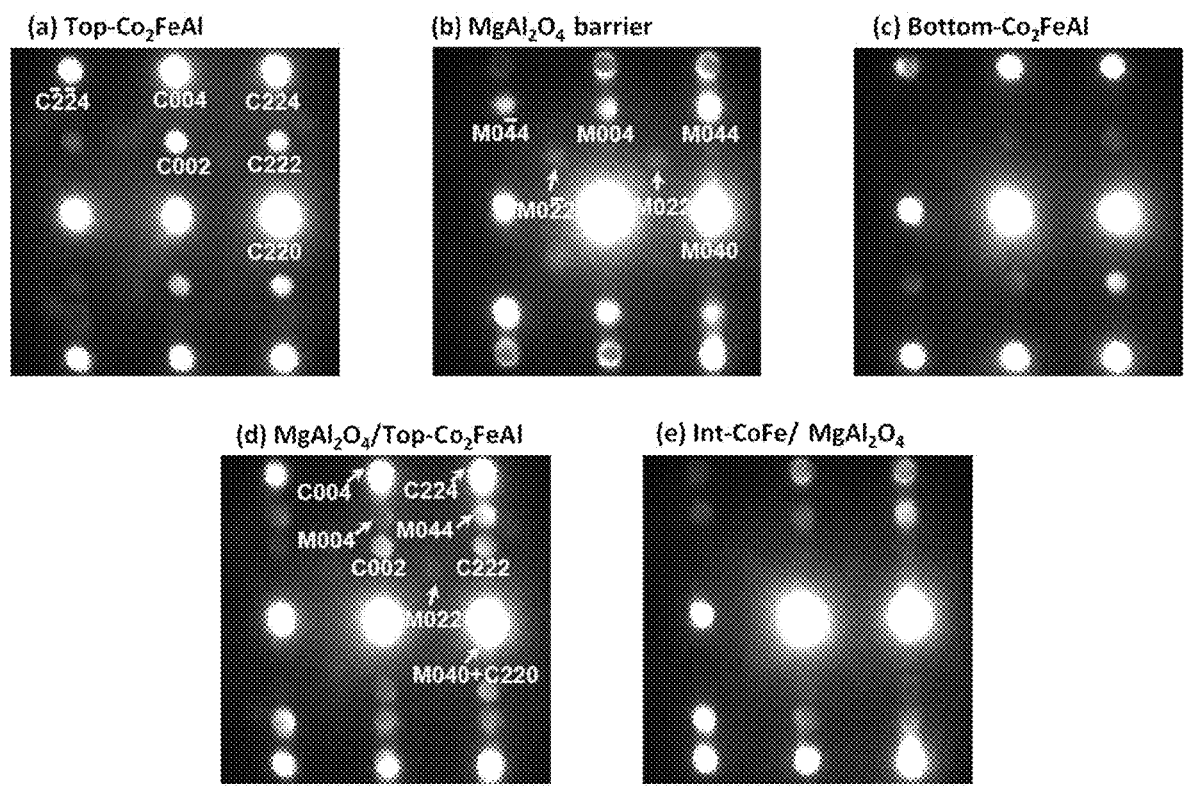
FIG. 9 is a view that illustrates nano electron beam diffraction (NBD) images corresponding to respective parts in the ADF-STEM image of the magnetic tunnel junction (MTJ element) shown in FIG. 8.

FIG. 9 illustrates a nano electron beam diffraction image. In the figure, FIG. 9(a) is an image inside the upper $Co_2FeAl$ layer, FIG. 9(b) is an image inside the $MgAl_2O_4$ layer, FIG. 9(c) is an image inside the lower $Co_2FeAl$ layer, FIG. 9(d) is an image near the interface between the $MgAl_2O_4$ layer/the upper $Co_2FeAl$ layer, and FIG. 9(e) is an image near the interface between the CoFe insertion layer/the $MgAl_2O_4$ layer. Further, in the figures, "C" and "M" described in spots denote diffraction spots corresponding to $Co_2FeAl$ and $MgAl_2O_4$, respectively. Firstly, from the result that a spot in a {022} plane meaning the formation of a spinel ordered structure (referred to as M022 and the like) can be observed in FIG. 9(b), it can be realized that the barrier layer has a spinel structure. Thus, in the case of using an ordinary CoFe ferromagnetic layer, the layer has a crystal structure, from which a high TMR ratio much more than 100% cannot be obtained easily. In FIGS. 9(a) and 9(c), {002} and {222} B2 superlattice spots can be observed in both of the upper and lower $Co_2FeAl$ layers (referred to as C002 and the like). Whereas, from the result that no {111} superlattice spot which represents an $L2_1$ ordered structure can be observed at all in the $Co_2FeAl$ layers, it can be realized that the layer has a B2 structure. Further, from the result that B2 superlattice spots can be clearly observed also in the upper interface (d), it can be resulted in that the upper $Co_2FeAl$ interface had significantly high quality, and the high TMR ratio was able to be obtained. From the result that a B2 superlattice spot, which is relatively weak due to the insertion of the CoFe layer, can be observed in the lower interface (e), it can be considered that the lower $Co_2FeAl$ layer also contributed to realize the high TMR ratio.

Also in the B2 alloy, use of the $MgAl_2O_4$ barrier having the spinel ordered structure causes the band folding effect similarly to the BCC-based alloy due to the difference of their lattice unit sizes, so that the spin polarization may be decreased significantly. However, if the alloy is a half metal, and can be used as ferromagnetic bodies for both of the upper and lower barrier layers, such decrease of the spin polarization cannot occur. Thus, the MTJ element structure of the present invention can solve the problem of the decrease in TMR ratio, which is caused by the use of the barriers having the spinel structure with the large lattice unit size and its similar structure, by sandwiching the barrier layer by the B2-type Co-based Heusler alloy layers that have the high spin polarization. Further, the MTJ element shown in Examples 2 and 3 exhibited the high TMR ratios, regardless of the suggestion that the lower $Co_2FeAl$ layer did not exhibit P=1, which was expected as a half metal, was obtained. Thus, it can be recognized that, even if one of the B2 alloy layers is not in the perfectly spin-polarized state, the MTJ element structure and the manufacturing method shown in the embodiments of the present invention are effective.

Incidentally, Examples 1 to 3 have provided the example of forming the layer of Mg (0.45 nm)/MgAl alloy (0.75 nm) and subsequently treating the layer by oxidation so as to form the barrier layer, but it has been confirmed that similar results as those in the above-described examples can be obtained also in the case of omitting to form the Mg layer and forming an MgAl layer of 1.2 nm instead, and in the case of forming an $Mg_{40}Al_{60}$ layer with a higher Mg content than that of $Mg_{19}Al_{81}$ after the film formation as a replace of the Mg layer.

Comparative Example 1

Next, an $MgAl_2O_4$ barrier in the case of limiting a manufacturing temperature of an MTJ element up to 375° C. will be described as a comparative example. After manufacturing Cr (40 nm)/CoFe (25 nm)/$Co_2FeAl$ (5 nm)/a CoFe insertion layer (1 nm) on an MgO (001) substrate by the same method as that in Example 3, a structure of Mg (0.45 nm)/MgAl (0.9 nm) was subsequently manufactured, and then, a barrier layer was manufactured by the same method as those in Examples 1 to 3. Thereafter, a CoFe (5 nm) layer was manufactured by sputtering, and was subsequently treated by heat at 300° C. in vacuum. Then, after forming IrMn (12 nm)/Ru (7 nm) as an upper electrode by the same method as those in Examples 2 and 3, the sample was taken out. Subsequently, the sample was treated by heat at 375° C. in vacuum in a magnetic field for 30 minutes.

Figure 10:
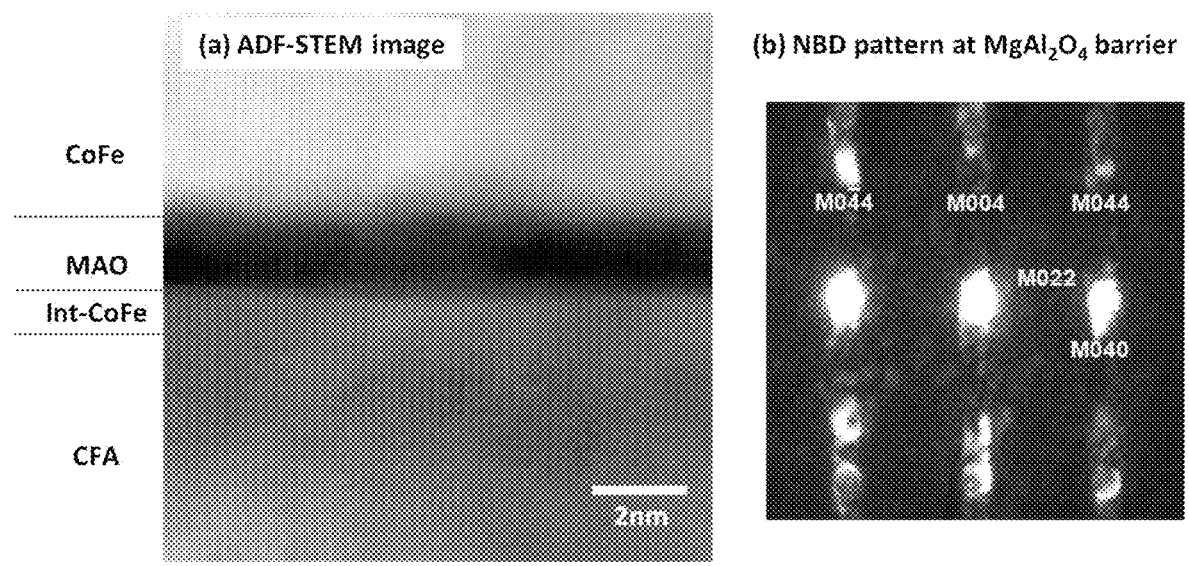
FIG. 10(a) illustrates an ADF-STEM image of a cross-section of a magnetic tunnel junction (MTJ element) having an $MgAl_2O_4$ layer with a disordered structure.
FIG. 10(b) is a view that illustrates an NBD image obtained from $MgAl_2O_4$.

FIG. 10(a) illustrates an ADF-STEM image of the formed MTJ element. Observation direction was the same as that of FIG. 8(a). Further, FIG. 10(b) shows an NBD image of $MgAl_2O_4$. In FIG. 10(a), an $MgAl_2O_4$ interface with high-quality epitaxial growth and completely matched lattices can be observed. Whereas, in FIG. 10(b), no {022} spot that shows a spinel ordered structure can be observed at all. Thus, it can be realized that the $MgAl_2O_4$ barrier manufactured at the low temperature had a disordered structure. Further, this element exhibited a TMR ratio as high as 280% at room temperature, and this is because the barrier layer thereof had such a disordered structure. Since spinel ordering is promoted at a temperature higher than about 400° C., for obtaining a TMR ratio exceeding 250% at a room temperature under such manufacturing conditions, B2-type Heusler alloy having high spin polarization is necessary to be formed not only for the lower ferromagnetic layer but also for the upper ferromagnetic layer.

Comparative Example 2

Next, an example of using MgO instead of $MgAl_2O_4$ as the barrier layer of the MTJ element will be described as a comparative example (Non Patent Literature 4). After manufacturing a Cr (40 nm) underlayer on an MgO (001) substrate, a $Co_2FeAl$ layer of 30 nm was manufactured by an RF sputtering method. Thereafter, heat treatment was carried out at 480° C. in a vacuum chamber for 15 minutes, and was subsequently cooled to a room temperature. Then, an MgO layer of 1.8 nm was formed by an RF sputtering method using MgO as a target. Subsequently, a $Co_2FeAl$ layer of 5 nm was formed by the above described method. Then, after forming IrMn (12 nm)/Ru (7 nm) as the upper electrode, the sample was taken out, and was treated by heat at 450° C. in vacuum in a magnetic field for 60 minutes. After microfabrication, TMR ratios were measured at a room temperature and at a low temperature (15 K), and were 223% and 415%, respectively. These values are comparatively smaller than 342% at room temperature and 616% at the low temperature (4 K), which were measured in the case of using the $MgAl_2O_4$ barrier in Example 3. Only the smaller values were obtained because lattice mismatch of 3.8% between the $Co_2FeAl$ and the MgO inhibited the growth of the $Co_2FeAl$ layer with high crystallinity directly on the MgO.

Incidentally, the above explanation has been provided as the embodiments of the present invention, but the present invention is not limited to them. For example, in the case of stacking the barrier layer and the high spin-polarized magnetic layer of the present invention on an Si substrate or a Ge substrate particularly for the application to spin MOSFET, if using the nonmagnetic material having the spinel structure of the present invention as a barrier, a magnetic layer with less lattice distortion can be grown, so that it is consequently possible to structure a spin injection element that can inject spin from the magnetic layer into Si or Ge efficiently.

INDUSTRIAL APPLICABILITY

The MTJ element of the present invention can be applied not only to a magnetic head for a hard disk and an MRAM, but also to many kinds of spintronics devices including a spin resonance tunnel device made of a magnetic double tunnel junction, a spin logic device using a spin MOSFET and the like that requires efficient spin injection into a semiconductor, and high performance magnetic sensors.

Further, the MTJ element of the present invention can be utilized as a head sensor of a hard disk drive apparatus due to its high TMR ratio, whereby development of a hard disk drive apparatus with high capacity is made possible. Moreover, since the present invention can provide a layer of a barrier/half metal that can inject spin into a semiconductor layer with high efficiency, the MTJ element of the present invention can be used as a core of a spin MOSFET, whereby development of a non-volatile logic LSI circuit is made possible.

REFERENCE SIGNS LIST

1 MTJ element film
2 substrate
3 underlayer
4 first ferromagnetic layer
5 barrier layer
6 second ferromagnetic layer
7 upper electrode

The invention claimed is:
1. A magnetic tunnel junction comprising a tunnel barrier layer and two ferromagnetic layers that are each adjacent to the tunnel barrier layer, wherein a first of the two ferromagnetic layers is above the tunnel barrier layer and a second of the two ferromagnetic layers is below the tunnel barrier layer, wherein the tunnel barrier layer is made of a cubic nonmagnetic material having a spinel structure, and wherein both of the ferromagnetic layers are made of $Co_2FeAl$ Heusler alloy.

2. The magnetic tunnel junction according to claim 1, wherein lattice mismatch between the nonmagnetic material and the $Co_2FeAl$ is 3% or less.

3. The magnetic tunnel junction according to claim 1, wherein the nonmagnetic material is made of oxide of $Mg_{1-x}Al_x$ (0<x≤1) alloy.

4. The magnetic tunnel junction according to claim 1, wherein the nonmagnetic material is made of $MgAl_2O_4$.

5. The magnetic tunnel junction according to claim 1, exhibiting tunnel magnetoresistance of 250% or more and 34000% or less at a room temperature.

6. A spintronics device, which comprises the magnetic tunnel junction according to claim 1.

7. A spin injection element comprising a laminated film of a cubic nonmagnetic material having a spinel structure and a ferromagnetic body, wherein the ferromagnetic body is made of $Co_2FeAl$ Heusler alloy.

8. The magnetic tunnel junction according to claim 1, wherein lattice mismatch between the nonmagnetic material and the $Co_2FeAl$ is 1% or less.

9. The magnetic tunnel junction according to claim 1, wherein lattice mismatch between the nonmagnetic material and the $Co_2FeAl$ is 0.5% or less.

10. A method of manufacturing a magnetic tunnel junction, comprising:
   forming an underlayer on a single crystal substrate;
   forming a first ferromagnetic layer on the underlayer;
   forming a tunnel barrier layer on the first ferromagnetic layer, which includes forming an MgAl alloy layer on the substrate, on which the first ferromagnetic layer is formed, and performing oxidation treatment of the substrate on which the MgAl alloy layer is formed;
   forming a second ferromagnetic layer on the substrate on which the tunnel barrier layer is formed;
   changing a crystal structure of the tunnel barrier layer from a disordered structure into a spinel structure by performing heat treatment of the second ferromagnetic layer under predetermined heat treatment conditions; and
   forming at least one of an upper electrode layer and a cap layer on the substrate on which the second ferromagnetic layer is formed.

* * * * *